United States Patent

Matthews et al.

(10) Patent No.: US 6,855,916 B1
(45) Date of Patent: Feb. 15, 2005

(54) WAFER TEMPERATURE TRAJECTORY CONTROL METHOD FOR HIGH TEMPERATURE RAMP RATE APPLICATIONS USING DYNAMIC PREDICTIVE THERMAL MODELING

(75) Inventors: Brian Matthews, Somerville, MA (US); James R. Willis, Salem, MA (US); Paul E. Lustiber, Chelmsford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/732,161

(22) Filed: Dec. 10, 2003

(51) Int. Cl.⁷ ................................. F27B 5/14
(52) U.S. Cl. .................. 219/390; 219/405; 219/411; 392/416; 392/418; 118/724; 118/725; 118/50.1
(58) Field of Search ................. 219/390, 405, 219/411; 118/724, 725, 50.1; 392/416, 418

(56) References Cited

U.S. PATENT DOCUMENTS

| | | |
|---|---|---|
| 5,820,366 A | 10/1998 | Lee |
| 5,900,177 A * | 5/1999 | Lecouras et al. ........... 219/497 |
| 6,183,137 B1 | 2/2001 | Kojima et al. |
| 6,375,348 B1 | 4/2002 | Hebb et al. |
| 6,461,036 B1 | 10/2002 | Shajii et al. |
| 6,610,968 B1 | 8/2003 | Shajii et al. |

* cited by examiner

Primary Examiner—Shawntina Fuqua
(74) Attorney, Agent, or Firm—Eschweiler & Associates, LLC

(57) ABSTRACT

A method for thermally processing a substrate provides a target substrate temperature and generates a move profile of the substrate within a thermal processing system. An amount of heat is provided to the substrate, and one or more temperatures associated with one or more respective locations on the substrate are measured. A predicted temperature profile is further generated, wherein a predicted temperature of the substrate is based on the amount of heat provided and the one or more measured temperatures. The amount of heat provided to the substrate is further regulated, based on the predicted temperature profile, wherein the substrate is thermally processed generally according to the intended substrate temperature profile. The amount of heat provided to the substrate can be further regulated by controlling a position of the substrate within the thermal processing system.

24 Claims, 7 Drawing Sheets

WAFER TEMPERATURE TRAJECTORY CONTROL METHOD FOR HIGH TEMPERATURE RAMP RATE APPLICATIONS USING DYNAMIC PREDICTIVE THERMAL MODELING

FIELD OF THE INVENTION

The present invention relates generally to semiconductor processing systems, and more specifically to a method for controlling a thermal processing of a substrate.

BACKGROUND OF THE INVENTION

Thermal processing systems have been widely known and used for many years to perform a variety of semiconductor fabrication processes, including annealing, diffusion, oxidation, and chemical vapor deposition. As a result, these processes are well understood, especially with regard to the impact of process variables on the quality and uniformity of resulting products. Thermal processing furnaces typically employ either a horizontal-type furnace or a vertical-type furnace. For some applications, vertical-type furnaces are preferred because they create fewer particles during use, thus decreasing an incidence of contamination and workpiece waste; they can be easily automated, and they typically require less floor space because of their relatively small footprint.

Conventional furnaces are typically designed to heat semiconductor wafers to desired temperatures either to promote diffusion of implanted dopants to a desired depth, or to perform other conventional processing techniques, such as an application of an oxide layer to a wafer or a deposition of a chemical vapor layer to the wafer. Heating requirements associated with the wafer are generally important and are typically closely monitored, especially when performing processes such as a spike anneal process.

Generally, a spike anneal process rapidly raises the temperature of the substrate from a relatively low temperature to a predetermined peak or target temperature, then cools the wafer as quickly as possible, thus minimizing the thermal budget associated with the wafer. The thermal budget, for example, is generally defined as the length of time wherein the wafer temperature is greater than a given temperature threshold. For example, a typical thermal budget temperature threshold can be approximately 50° C. less than the target temperature.

In order to achieve desirably low thermal budgets for the spike anneal processes, hot wall thermal processing technology, for example, has been utilized. Hot wall thermal processing generally comprises moving the wafer upward and then downward in a bell jar furnace, thus exposing the wafer to a temperature gradient within the bell jar. However, controlling the wafer position in order to achieve a consistent spike peak temperature and a minimal thermal budget has typically been a problem.

Various temperature trajectories or profiles have been conventionally defined (both simple and time optimized), wherein full closed loop temperature control has been implemented for spike anneal-type thermal processing, and some success has been achieved. Temperature profiles can be generally reliably defined and utilized, provided that time-temperature curves generally define a non-aggressive spike profile (e.g., thermal budgets of 1.8 and higher), and that an average temperature ramp rate is generally sub-optimal.

In contrast, a Move-Wait-Move technique has also been utilized with some success. With the Move-Wait-Move method, the wafer is moved upward in the bell jar (e.g., moved to a higher temperature environment) under closed-loop position control using a predetermined position profile, rather than a temperature profile. The wafer, for example, remains at the elevated position (e.g., the "Wait" position) until a predetermined trigger temperature is reached. When the trigger temperature is reached, the wafer is moved downward (e.g., moved to a lower temperature environment), again under closed loop position control, following the predetermined position profile. If the trigger point is selected properly, the desired peak spike temperature can be achieved.

The Move-Wait-Move process can produce fairly aggressive thermal budgets with good repeatability for wafers when the trigger temperature has been correctly tuned. The Move-Wait-Move process produces several benefits over full closed loop processing. For example, critical temperature measurements are made while the elevator is stopped, as opposed to moving, such that artifacts produced by dynamic stray light compensation are eliminated. Furthermore, the motion which produces the final spike profile is performed using a simple point to point move, and as such, vibration for given velocity and acceleration limits are generally minimized. Still further, the motion profile, as well as the relationship between presoak height, presoak trigger temperature and spike ramp height, appear to be critical in the tuning and repeatability of radial uniformities from wafer to wafer. Consequently, variations in the actual move profile utilized in full closed loop processing appear to deleteriously increase the total range and maximum value of the radial non-uniformity.

However, despite the advantages over full closed loop temperature control, it appears that the Move-Wait-Move process (having a fixed predetermined trigger temperature) cannot be effectively optimized for use with wafers of varying characteristics, since there is no dynamic compensation for the wafers variations. Without some form of dynamic compensation for wafer variations, repeatability of peak spike temperature is generally compromised.

Therefore, a need exists for a method for automatically varying the trigger temperature threshold used during the "Wait" part of the Move-Wait-Move spike technique, wherein the variation is based on dynamic measurements of wafer temperature. Such a method will improve the repeatability of the peak temperature, as well as optimize the thermal budget when applied to wafers of varying characteristics.

SUMMARY OF THE INVENTION

The present invention overcomes the limitations of the prior art by utilizing dynamic predictive modeling and establishing a relationship between a first derivative of wafer temperature and a change in trigger temperature required to produce a consistent peak temperature, while further maintaining aggressive thermal budget capabilities of full closed-loop position control. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed to a method for thermally processing a substrate in a thermal processing system, wherein an amount of error in the thermal process is generally minimized. The wafer processing method generates a predicted temperature profile using a dynamic predictive model, wherein the predicted temperature profile is based on a predetermined process recipe, a measured temperature of the substrate, and a thermal model of the substrate in the thermal processing system, wherein a heating of the substrate is controlled based, at least in part, on the predicted temperature profile. The control further achieves an intended temperature profile or target temperature.

The method further comprises controlling the temperature of the substrate within a thermal processing system by executing a predetermined action when a predicted temperature becomes greater than or equal to a predetermined target temperature of the substrate. For example, the substrate is moved within a vertical thermal processing furnace according to a predetermined move profile in response to the predicted temperature becoming greater than or equal to a predetermined maximum spike anneal temperature. The predicted temperature, for example, comprises a predicted maximum temperature of the substrate, and the predicted temperature can further be determined by an interpolation of the predicted temperature profile.

According to another exemplary aspect of the invention, an offset to the predetermined move profile is ascertained, wherein the offset is further utilized to predict a temperature of the substrate upon a movement according to the predetermined move profile. For example, the measured temperature and an actual position of the substrate within the thermal processing system are utilized by the thermal model to determined the offset, wherein the offset is further utilized to predict the temperature of the substrate. Accordingly, the present invention is an adaptive processing method that predicts the substrate temperature during processing and controls the heating of the substrate based, at least in part, on the actual measured temperature.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
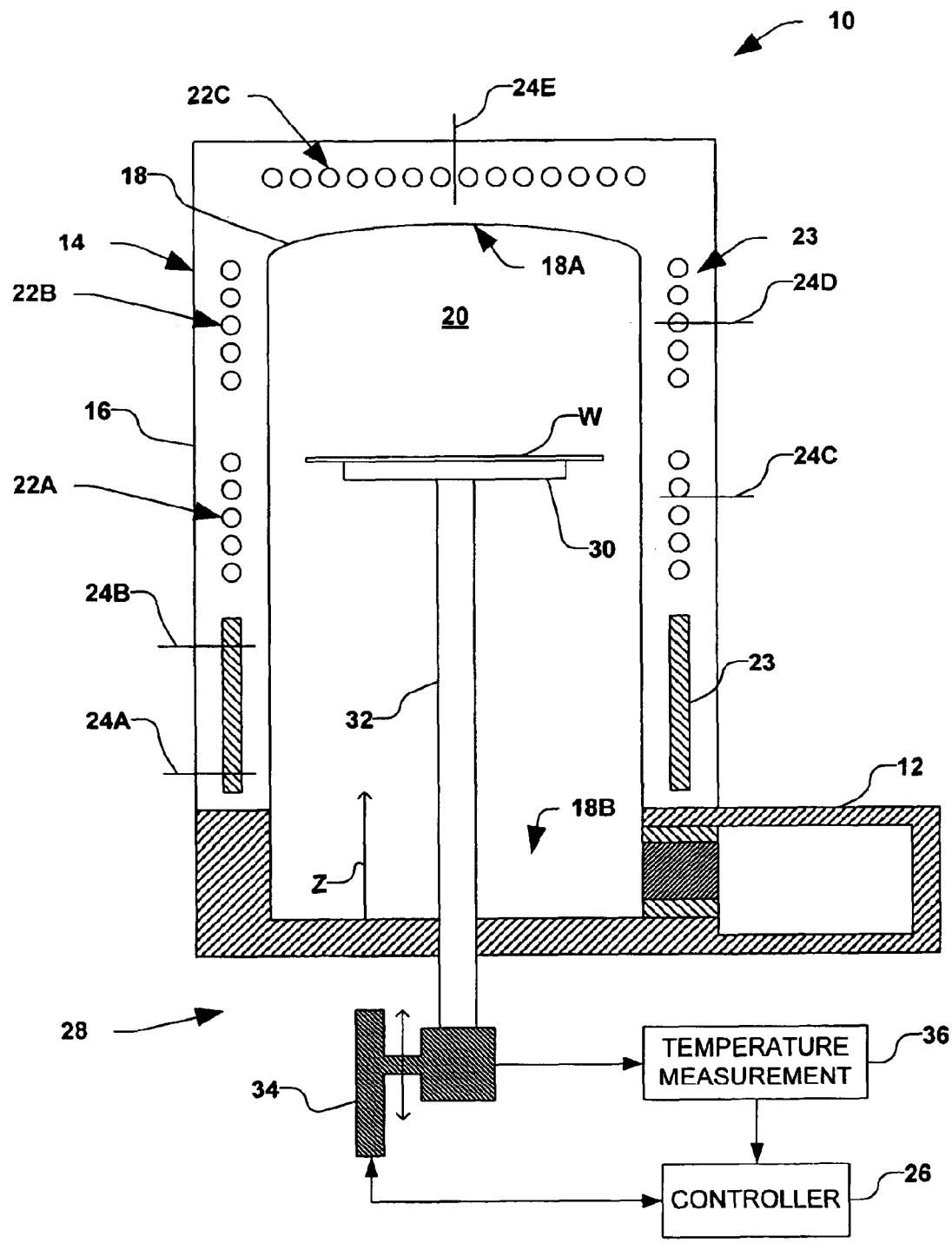
FIG. 1 is a perspective view of an exemplary thermal processing system according to one exemplary aspect of the present invention.

The present invention is generally directed towards a method for thermally processing a substrate. In particular, an amount of heat exposed to the substrate is controlled by predicting a temperature profile of the substrate with respect to time and comparing the prediction to a target value or profile. Accordingly, the present invention will now be described with reference to the drawings, wherein like reference numerals are used to refer to like elements throughout. It should be understood that the description of these aspects are merely illustrative and that they-should not be taken in a limiting sense. In the following description, for purposes of explanation, numerous specific details are set forth in order to provide a thorough understanding of the present invention. It will be evident to one skilled in the art, however, that the present invention may be practiced without these specific details.

In accordance with one aspect of the present invention, a method for thermally processing a substrate in a thermal processing system is provided, wherein a control of the thermal process utilizes dynamic predictive thermal modeling. The processing method generates a predicted temperature profile based on a given processing recipe and measured temperature of the substrate, and controls a heating of the substrate in order to achieve an intended temperature profile. The method further comprises controlling the temperature of the substrate within the thermal processing system by executing a predetermined action when a predicted temperature becomes greater than or equal to a predetermined target temperature of the substrate. For example, the substrate is moved within a vertical thermal processing furnace in response to the measured wafer temperature when the predicted temperature becomes greater than or equal to a predetermined maximum spike anneal temperature. The present invention is thus an adaptive processing method that predicts the substrate temperature during processing, wherein the prediction is based on a thermal model of the thermal processing system and the substrate, and wherein the method controls the heating of the substrate based, at least in part, on the actual measured temperature.

Referring now to the figures, FIG. 1 illustrates an exemplary thermal processing system 10 for thermally processing a substrate (e.g., a silicon wafer) in accordance with one exemplary aspect of the present invention. According to one example, the thermal processing system 10 comprises a wafer handling system 12 adapted to load a wafer W into, and conversely remove the wafer from, a thermal processing furnace 14. The thermal processing furnace 14, for example, comprises a main outer housing 16 that encloses a vertical furnace having a cylindrical process tube 18 that has a closed end 18A and an opposed open end 18B. The cylindrical tube 18 generally defines a heating or process chamber 20. The process tube 18, for example, can be used as a constant or continuous heat source. As used herein, the term "continuous" is intended to include continuity both terms of both temperature and heating surface area. The process tube 18, for example, can be formed of any high temperature material such as alumina, silicon carbide, and other suitable ceramic materials.

According to one example, the process tube 18 is surrounded by a three zone resistive heating module comprising three suitable heating elements 22A, 22B, and 22C. The heating elements 22A, 22B, and 22C, for example, comprise resistance-heated elements or RF heated black body cavity susceptors as a primary heat source. This particular type of heat source is generally simple to implement, is well characterized, and is widely accepted as a reliable technique for stable and uniform control of furnace temperature. According to one exemplary aspect of the invention, the heating elements 22A, 22B, and 22C form part of a vertically oriented, three zone resistive heater module 23. The heating elements 22A, 22B, and 22C, for example, can be comprised of low mass, high temperature metallic wires (not shown). Insulation (not shown) surrounding each heating element 22A, 22B, and 22C can be comprised of ceramic fibers having a high insulation value and a low thermal mass. The heating elements 22A, 22B, and 22C, for example, are further designed for a fast response to temperature changes. The heater module 23, for example, can also include an air cooling system (not shown) to help cool the processing chamber 20. A diameter of the process tube 18, and thus a size of the vertical furnace 14 can be easily scaled to accommodate wafers W of varying sizes.

According to another exemplary aspect of the invention, the thermal processing system 10 comprises any suitable thermal processing apparatus that is adapted to thermally process silicon wafers at selected temperatures. According to a preferred embodiment, the illustrated thermal processing system 10 incorporates a rapid thermal processing furnace 14 sold under the trade name of Summit XT by Axcelis Technologies, USA. The Summit XT design system is particularly advantageous as a single wafer furnace that achieves high repeatability and uniform results with relatively low maintenance requirements. The thermal processing furnace 14, for example, is operable to develop a temperature gradient by using a "hot wall" vertical processing chamber 20 for single wafer processing, as opposed to multiple lamp banks. Such a hot wall chamber 20 is developed by disposing the heater module 22 at the top (e.g., the closed end 18A) of the chamber 20 (e.g., a bell jar) and a cooling system 23 at the bottom (e.g., the open end 18B) of the chamber, thereby creating a generally smooth temperature gradient from the top of the process chamber to the bottom, wherein the top of the chamber substantially approaches a black body radiator.

With the temperature profile of the thermal processing chamber 20 generally fixed, the desired temperature is achieved, for example, by simply adjusting a position Z of the wafer W within the processing chamber. Temperature ramp up and ramp down rates of the wafer W, as well as a maximum target temperature associated with a spike anneal process, for example, can be controlled by a velocity at which the wafer is vertically moved through the temperature gradient within the chamber 20. One or more additional heating or-cooling stages (not shown) can further be provided, in addition to the illustrated system 10. The selected ramp rates, velocities, and/or maximum target temperatures, for example, are generally determined by a process recipe, thus generally determining the overall heating and cooling rates of the wafer.

In accordance with one example, the illustrated thermal processing system 10 employs a series of thermocouples, such as thermocouples 24A–24E, that are distributed about the furnace 14 to measure a temperature of the furnace. The thermocouples measure temperature at selected locations for subsequent use by a controller 26. The controller 26, for example, can establish a selected thermal gradient along the process tube 18, and output signals (not shown) such as spike thermocouple temperature settings generated by the thermocouples 24A–24E can be sampled to ensure that the desired temperature gradient is maintained. The temperature measurements from the thermocouples 24A–24E can further be utilized to assist the system 10 in determining certain selected furnace set points prior to processing each wafer W. For example, before processing a wafer W, a thermal gradient along the process tube 18 is established by adjusting the heating elements 22A–22C until desired thermocouple set points are reached. Typically, the thermocouple set points are adjusted such that the top 18A of the process chamber 20 is disposed at a temperature which is higher, such as 200° C., than a desired wafer processing temperature. The heating elements 22A–22C, for example, are continuously and actively controlled through the thermocouple measurements during wafer processing in order to maintain a stable thermal environment.

According to another example, the heating elements 22A, 22B, and 22C are arranged about the process tube 18 in order to heat the processing chamber 20 to a predetermined temperature, such as between 400° C. and 1300° C. in the case of a chemical vapor deposition, or between 800° C. and 1300° C. in the case of oxidation or diffusion. The heating elements 22A–22C, for example, furthermore form an isothermal heating zone (not shown) within the processing chamber 20. The controller 26, for example, can be further utilized to regulate the temperature of the process tube 18 according to the exigencies of the processing technique. For example, according to one example, a temperature sensor (not shown), such as an optical pyrometer, is coupled to the controller 26, and can be used to sense the chamber temperature for providing a signal which can be correlated to wafer temperature.

The wafer handling system 12, for example, comprises any suitable wafer transport assembly for loading and unloading the wafer W to and from an elevator subsystem 28. An example of one type of wafer handling system is described in U.S. Pat. No. 5,820,366, the contents of which are herein incorporated by reference. The elevator subsystem 28, for example, comprises a quartz wafer holder 30 coupled to a wafer elevator tube 32. The elevator tube 32, for example, further slidingly engages a guide rod 34. According to another example, the elevator subsystem 28 further comprises a suitable servo motor (not shown) coupled to the guide rod 34 or elevator tube 32 for selectively moving the elevator vertically along the guide rod into and out of the process chamber 20, thus controlling a position Z of the wafer W within the process chamber. The servo motor (not shown), for example, is further controlled by the controller 26, wherein the controller or elevator subsystem 28 further comprises a motion controller (not shown) or encoder which is operable to determine the position Z of the wafer W within the chamber 20. The controlled position Z of the wafer W with respect to time t, for example, can be stored in a move profile Z(i) of the wafer, wherein i is associated with discrete points in time 0, 1, 2 . . . N–1, where N represents the total number of discrete points in the move profile.

The controller 26 is further operable to actuate the elevator subsystem 28, which in turn moves the wafer W in the process chamber 20 so as to generally achieve, attain, follow or match as closely as possible the intended move profile Z(i). The elevator subsystem 28 is operable to move the wafer W in the process chamber 20 in a predetermined manner so as to heat or cool the wafer in a selected manner. The move profile Z(i), for example, is generally determined by the controller from the process recipe, wherein the process recipe comprises, among other processing parameters, a predetermined maximum velocity $V_{max}$, maximum acceleration $A_{max}$, maximum position $Z_{max}$, and minimum position $Z^{min}$ of the wafer W, wherein the maximum position $Z_{max}$ is associated with a desired target temperature $T_{target}$ or spike anneal temperature. According to one example, the desired target temperature $T_{target}$ is approximately 1050° C.

According to another exemplary aspect of the present invention, the thermal processing system 10 comprises a temperature measurement system 36 for detecting, measuring and/or determining one or more actual temperatures T of the wafer W within the thermal processing chamber 20. The temperature measurement system 36, for example, comprises one or more pyrometers (not shown) for detecting one or more parameters of the wafer W at one or more locations on the wafer, such as the temperature T. For example, the one or more pyrometers (not shown) are operable to detect an amount of light emitted and reflected from the wafer W, and then to generate one or more respective signals which are sent to the controller 26. The controller 26, based upon the one or more signals from the one or more pyrometers, for example, is further operable to determine one or more emissivities and temperatures T of the wafer W. Exemplary suitable temperature measurement systems 36 are disclosed and described in U.S. Pat. No. 6,375,348, U.S. Pat. No. 6,461,036, and U.S. Pat. No. 6,183,137, and the contents of said patents are herein incorporated by reference. The one or more pyrometers (not shown) can further be utilized to directly and non-invasively measure the actual wafer temperature T associated with one or more locations on the wafer W, such as a temperature at or near the center (not shown) of the wafer.

The controller 26, for example, is operable to accumulate selected processing data associated with the thermal processing system 10, and may further comprise a user interface (not shown) for allowing selected information to be inputted to the system 10 or exchanged between the system and a user. The user interface can be any suitable input device, such as one or more of a keyboard, monitor, mouse, and touch-screen. The controller 26 is further operable to generally regulate the temperature gradient within the process chamber 20 of FIG. 1, and employs the thermocouples 24A–24E to ensure that the proper temperature gradient is attained.

Figure 2:
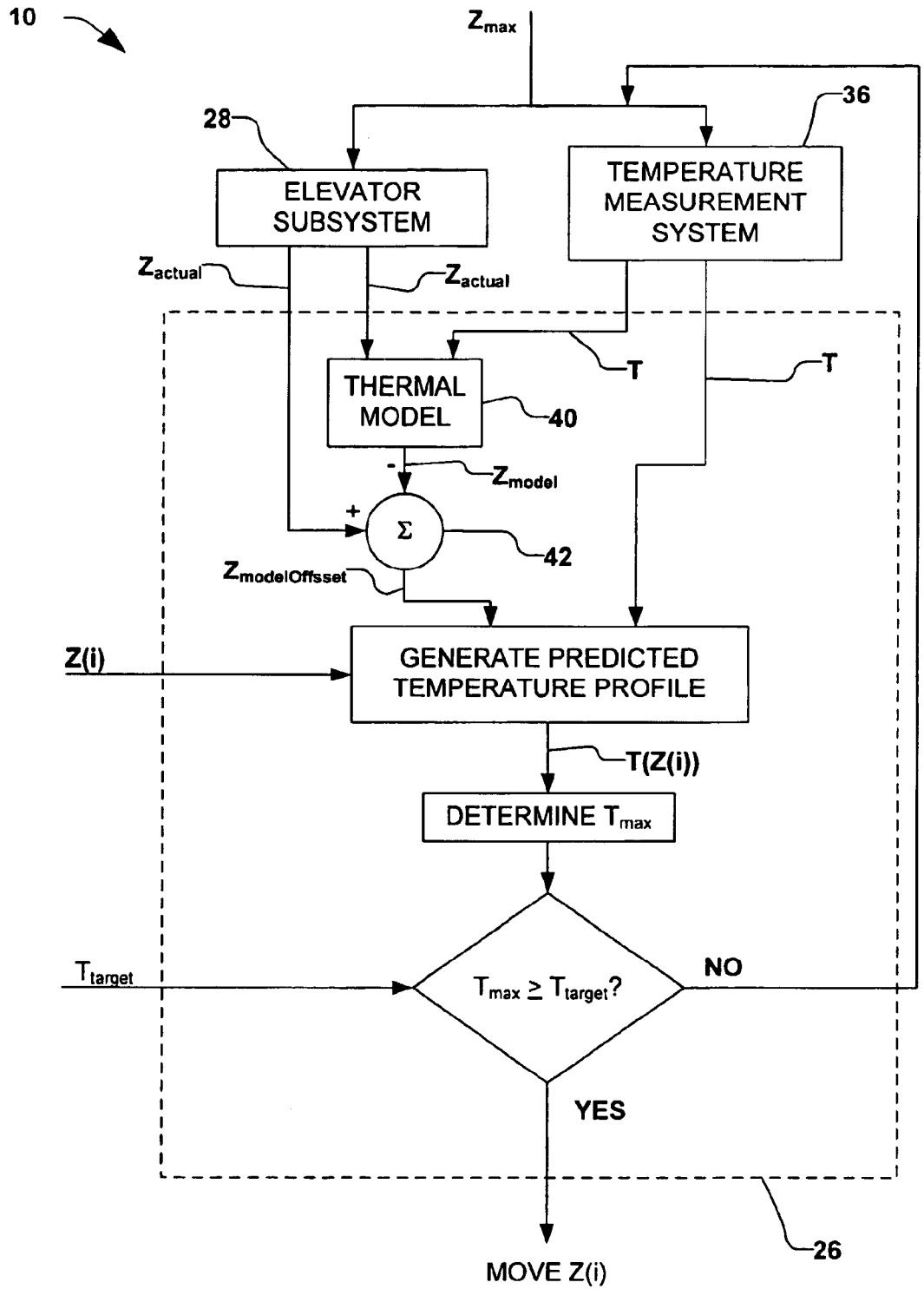
FIG. 2 is a combined functional and block diagram representing exemplary operational aspects of the wafer processing system according to another aspect of the present invention.

Referring now to FIG. 2, a combined functional and block diagram of the thermal processing system 10 is illustrated as an overview of one exemplary aspect of the present invention. As illustrated in FIG. 2, the controller 26 comprises any suitable computing apparatus, such as a computer or data processor, having suitable storage and processing elements. Preferably, the controller 26 stores a suitable temperature control program that controls the operation of the thermal processing system 10 in order to heat the wafer W according to an intended wafer temperature profile, trajectory, or target temperature of the wafer. The control program, for example, employs the actual wafer temperature T signal provided by the temperature measurement system 36, the actual wafer position $Z_{actual}$ provided by the elevator subsystem 28, a modeled wafer position offset $Z_{modelOffset}$ provided by a thermal model 40 of the thermal processing system and the substrate, and the move profile Z(i) generated by the controller 26 from the process recipe parameters to predict a temperature profile T(Z(i)) of the wafer W at varying positions Z within the process chamber 20, as will be discussed infra. The thermal model 40, for example, comprises a thermal model such as that described in U.S. Pat. No. 6,610,968, which is herein incorporated by reference in its entirety. It should be noted that the thermal model described in the '968 patent is only one example of a thermal model 40 of an exemplary thermal processing system, and other thermal models which are representative of various other thermal processing systems are contemplated by the inventors, and all such thermal models and thermal processing systems are understood to fall within the scope of the present invention.

In accordance with one exemplary aspect of the present invention, a total amount of incident power $W_{incident}$ on the wafer W within the process chamber 20 of FIG. 1, for example, can be expressed as a function of wafer position $Z_{wafer}$ by the function $W_{incident}(Z_{wafer})$. In this example, the incident power $W_{incident}$ on the wafer W can be modeled by the thermal model referenced in the '968 patent, wherein the total incident power $W_{incident}$ of the present invention is the sum of heat source terms $q_t(z)$ and $q_b(z)$ in equations (11) and (12) of the referenced patent. Therefore, the fraction of incident power [watts] absorbed by the wafer W can then be defined as:

$$W_{absorbed} = \epsilon(T) W_{incident}(Z_{wafer}) \qquad (1)$$

where $\epsilon(T)$ a emissivity of the wafer W at given temperature T[° K]. The power emitted from the wafer W at temperatures T is defined by the Stephan-Boltzman Law:

$$W_{emitted} = 2\epsilon(T) \sigma A_{wafer} T^4 \qquad (2)$$

where $\sigma$=Stephan-Boltzman Constant [watts/m$^{2°}$ K$^4$], and $A_{wafer}$=a surface area [m$^2$]of one side of the wafer W.

Thus, the net power into or out of the wafer at any given time is:

$$W_{net} = W_{absorbed} - W_{emitted} \qquad (3)$$

Therefore, the net power $W_{net}$ will generate a change in temperature T associated with the wafer W. According to one exemplary aspect of the invention, a modeled rate of the temperature change $T_{dotModel}$ is utilized to generate or predict the temperature profile T(Z(i)). $T_{dotModel}$ is further related to the net power $W_{net}$ by the thermal mass of the wafer W as follows:

$$T_{dotModel} = W_{net}/M_{thermal}[° K/sec] \qquad (4)$$

where $$M_{thermal} = M_{wafer} C_p(T)[\text{watt } sec/° K] \qquad (5)$$

and where $M_{wafer}$=a mass [kg] of the wafer W and $C_p$=a specific heat [watt sec/° K kg] of wafer W at temperature T. Hence, substituting equations (1) and (2) into (3) and equations (3) and (5) into equation (4) yields:

$$T_{dotModel}(T,Z) = [\epsilon(T) W_{incident}(Z_{wafer}) - 2\epsilon(T) \sigma A_{wafer} T^4]/[M_{wafer} C_p(T)]$$

wherein the modeled rate of temperature change $T_{dotModel}$ is described as a function of the measured temperature T and wafer position Z.

The present invention, according to another exemplary aspect, further utilizes thermal models of both the process chamber temperature gradient (e.g., in a bell jar) and the wafer in order to estimate the amount of thermal power incident to the wafer (e.g., $W_{incident}(Z_{wafer})$), as well as the instantaneous rate of change of wafer temperature $T_{dotModel}$ as a result of the incident power. Furthermore, a modeled estimate of the time derivative of temperature at time i can be defined as $T_{dotModel}(i)$. $T_{dotModel}(i)$, for example, can be estimated as a function of wafer temperature T(i) and an adjusted wafer position $Z_{adjusted}(i)$, wherein the wafer position is adjusted for a model offset, as will be discussed infra. Therefore, we can say:

$$T_{dotmodel}(i)=f(T(i),Z_{adjusted}(i)). \quad (7)$$

Given an initial temperature measurement T(0), the rate of temperature change can be used to estimate the temperature at future points in time. For example, a three iteration estimation method can be performed, wherein at the next profile point i+1, the first estimate of temperature would be:

$$T_{Est1}(i+1)=T(i)+(dt)(T_{dotModel}(i)) \quad (8)$$

wherein dt is the time interval [sec] between profile points i and i+1. The first estimate of the modeled time derivative of temperature at profile point i+1 would then be:

$$T_{dotModel\_Est1}(i+1)=f(T_{Est1}(i+1),Z_{adjusted}(i+1)) \quad (9)$$

Then, at profile point i+1, the second estimate of temperature would be:

$$T_{Est2}(i+1)=T(i)+(dt)(T_{dotModel}(i)+T_{dotModel\_Est1}(i+1))/2 \quad (10)$$

and the second estimate of the modeled time derivative of temperature at profile point i+1 would be:

$$T_{dotModel\_Est2}(i+1)=f(T_{Est2}(i+1),Z_{adjusted}(i+1)). \quad (11)$$

T(i+1) can further be considered the final value of temperature at the next profile point i+1. Thus, the next temperature at profile point i+1 would be:

$$T(i+1)=T(i)+(dt)(T_{dotModel}(i)+T_{dotModel\_Est2}(i+1))/2. \quad (12)$$

Consequently, using T(i+1) and $Z_{adjusted}(i+1)$, each subsequent temperature T(i) can be found along the $Z_{adjusted}(i)$ move profile. The exemplary estimation technique described above generally improves an accuracy of the predicted temperature profile T(Z(i)). However, it should be noted that various other estimation techniques may be utilized, and all such techniques are contemplated as falling within the scope of the present invention.

According to still another exemplary aspect of the present invention, the move profile Z(i) used to generate the predicted temperature profile T(Z(i)) is predetermined, and does not change from wafer to wafer. For example, the move profile Z(i) is the same move profile the motion controller will use for every wafer W processed in order to move the wafer W after the desired peak temperature (e.g., the target temperature $T_{target}$) is predicted. According to another example, the actual movement of the wafer W according to the move profile Z(i) is not of particular importance, other than that a rapid monotonic move is most beneficial for achieving a high temperature ramp rate. For example, such a move profile Z(i) can be calculated apriori.

According to yet another exemplary aspect of the present invention, the thermal model 40 of FIG. 2 is utilized to calculate a theoretical or modeled position $Z_{model}$ of the wafer W from the measured temperature T and actual position $Z_{actual}$ for each pyrometer and motion controller update, respectively. The thermal power function $W_{incident}(Z_{wafer})$ is further used to generate a mapping or lookup table (not shown) of incident power $W_{incident}$ versus wafer position $Z_{wafer}$. The lookup table, for example, can be consequently used in reverse to find wafer position $Z_{wafer}$ for a given $W_{incident}$. This reverse mapping function can be defined as:

$$Z_{wafer}=f(W_{incident}). \quad (13)$$

Using the same relation of incident, absorbed, and emitted power as described above, we can then say:

$$W_{incident}=[2\epsilon(T)\sigma A_{wafer}T^4+T_{dotModel}M_{wafer}C_p(T)]/\epsilon(T). \quad (14)$$

Accordingly, substituting equation (14) into (13), we get the modeled wafer position:

$$Z_{model}=f([2\epsilon(T)\sigma A_{wafer}T^4+T_{dotModel}M_{wafer}C_p(T)]/\epsilon(T)) \quad (15)$$

Furthermore, according to another exemplary aspect, the above values are repeatedly calculated, such as at a sample time n, n+1, n+2, etc. For example, a sampling frequency of greater than approximately 300 Hz can be utilized by the controller 26 for temperature acquisition, thus providing a high degree of accuracy for the model. The modeled time derivative of temperature change can therefore be expressed as a function of discrete time as:

$$T_{dotModel}(n)=T_{dotModel}(T_{model}(n-1),Z(n)) \quad (16)$$

where $T_{model}(n-1)$ the modeled temperature derived for sample n-1, and Z(n) the actual position ($Z_{actual}$) of the wafer W at the present sample time n. Thus, the modeled wafer position of equation (15) can be expressed as a function of discrete time as:

$$Z_{model}(n)=f([2\epsilon(T(n))\sigma A_{wafer}T(n)^4+T_{dotModel}(n)M_{wafer}C_p(T(n))]/\epsilon(T(n))) \quad (17)$$

where T(n)=the measured wafer temperature at the present sample time n.

Still further, according to another exemplary aspect of the invention, an adjustment to $T_{dotModel}(n)$ of equation (16) can be made to improve the resulting accuracy. The adjustment can be described as a function of discrete time as:

$$T_{dotModelAdjusted}(n)=T_{dotModel}(T_{model}(n-1),Z(n))+MTG*(T(n-1)-T_{model}(n-1)) \quad (18)$$

where MTG=a Model Tracking Gain which is used to actively adjust $T_{dotModel}(n)$ of equation (16) over time. The Model Tracking Gain MTG, for example, can be a predetermined value or function, or the MTG can be actively calculated by the controller 26 to adjust the model over time. Accordingly, the predicted modeled temperature $T_{model}(n)$ can be derived by integrating $T_{dotModelAdjusted}(n)$ over time n and can be expressed as:

$$T_{model}(n)=T_{model}(n-1)+T_{dotModelAdjusted}(n)\Delta t \quad (19)$$

where $\Delta t$ is a sampling period [sec] between consecutive samples. Therefore, $T_{model}$ at time n-1 can be expressed as:

$$T_{model}(n-1)=T_{model}(n-2)+T_{dotModelAdjusted}(n-1)\Delta t. \quad (20)$$

Accordingly, substituting the adjusted modeled time derivative of temperature change $T_{dotModelAdjusted}(n)$ for $T_{dotModel}(n)$ in equation (17), the active adjustment of the model can be implemented, wherein the modeled wafer position $Z_{model}(n)$ can be consequently described as:

$$Z_{model}(n)=f([2\epsilon(T(n))\sigma A_{wafer}T(n)^4+T_{dotModelAdjusted}(n)M_{wafer}C_p(T(n))]/\epsilon(T(n))). \quad (21)$$

According to yet another exemplary aspect of the invention, the controller 26 of FIGS. 1 and 2 generates the predicted temperature profile, wherein a peak or maximum predicted temperature $T_{max}$ is determined from the modeled wafer position $Z_{model}$. According to one example, the maximum predicted temperature $T_{max}$ is interpolated from the array of points $T(Z(i))$ using a standard three point quadratic interpolation. For example, if $T(i)$ is the maximum value in the predicted temperature array, then the points $T(i-1)$, $T(i)$ and $T(i+1)$ are fitted to an equation of the form $y=ax^2+bx+c$ to determine the maximum of $y(x)$. Using an interpolation to find $T_{max}$, for example, advantageously provides higher accuracy than simply using the maximum temperature in the $T(Z(i))$ array.

Figure 3A:
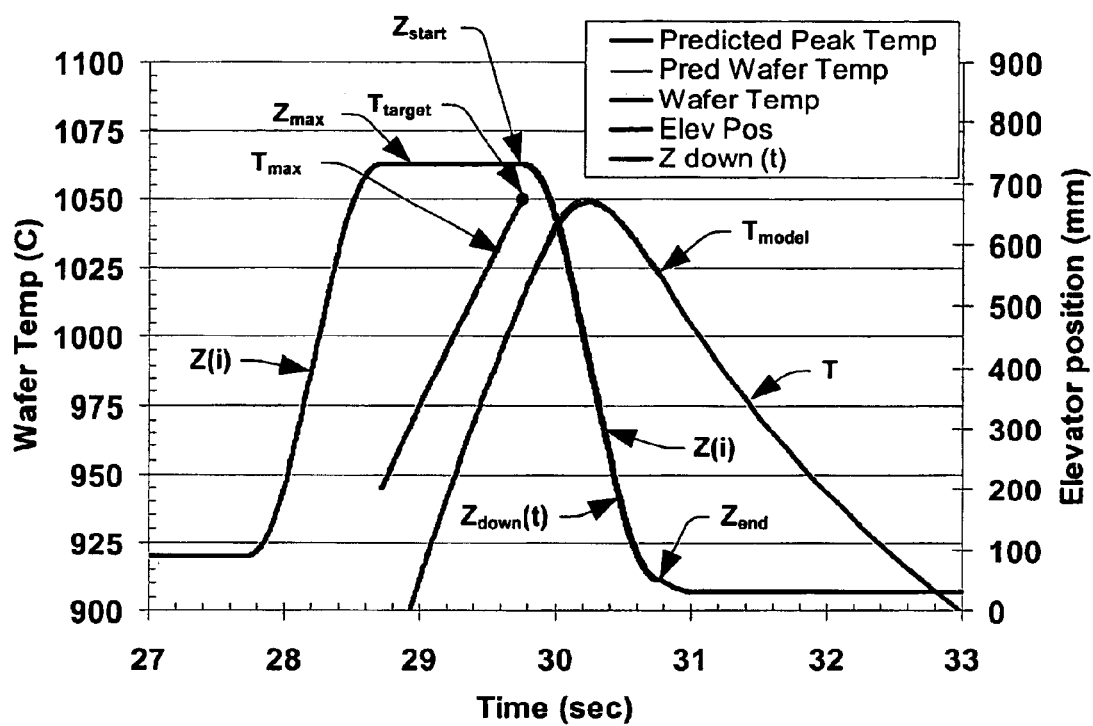
FIG. 3A is a chart of an exemplary spike anneal wafer movement and temperature profile according to one aspect of the present invention.

FIG. 3A illustrates an exemplary movement of the wafer W with respect to time in accordance with one example. Preferably, a simple trapezoidal move profile can be generated, wherein the move profile $Z(i)$ used by the motion controller comprises moving the wafer from an initial position $Z_{initial}$ to a maximum position $Z_{max}$ in the process chamber. According to one example, the movement from $Z_{initial}$ to $Z_{max}$ is predetermined, and is substantially openlooped. While at the $Z_{max}$ position, the wafer is heated, and the predicted temperature profile $T(Z(i))$ is generated with each update of the pyrometer and motion controller. As discussed above, the maximum temperature $T_{max}$ is interpolated from the array of points $T(Z(i))$. When $T_{max}$ becomes greater than or equal to the target temperature $T_{target}$, the move profile $Z(i)$ is again utilized by the motion controller to move the wafer from a start position $Z_{start}$ (e.g., a first position) associated with $Z_{max}$ to an end position $Z_{end}$ (e.g., a second position) in the process chamber, thus permitting the actual wafer temperature T to closely match the modeled temperature $T_{model}$. Again, the movement from $Z_{start}$ to $Z_{end}$ (e.g., referred to as $Z_{down}(t)$) is predetermined in this example, and is the movement is substantially openlooped.

Figure 3B:
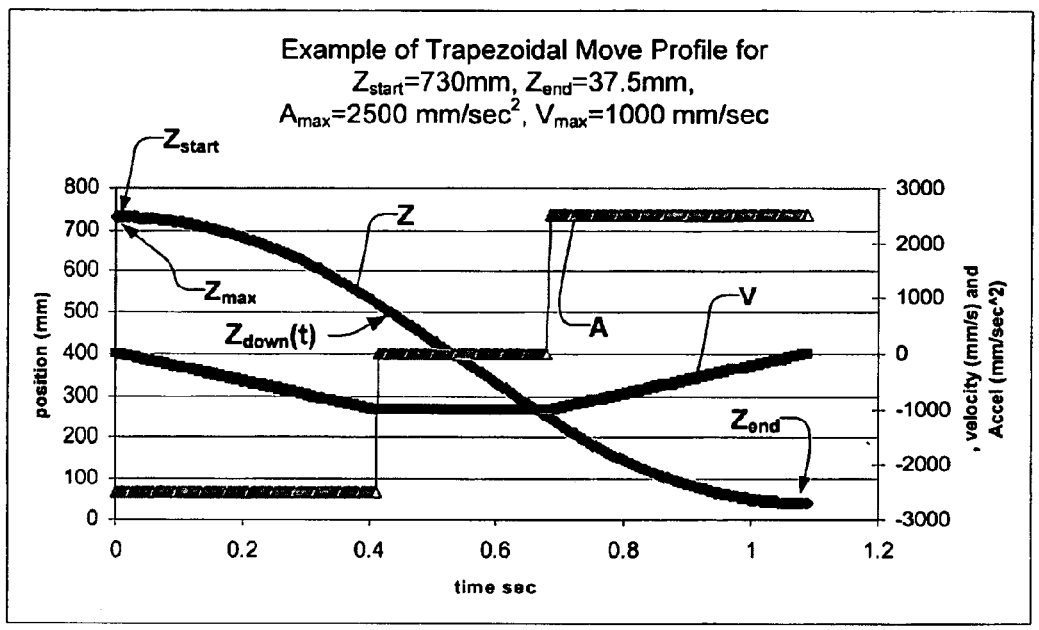
FIG. 3B is a chart of an exemplary wafer movement profile according to another aspect of the present invention.

FIG. 3B illustrates another exemplary movement of the wafer, wherein the move profile $Z(i)$ (e.g., the move profile $Z_{down}(t)$ illustrated in FIG. 3A) is generally defined by the start position $Z_{start}$ and end position $Z_{end}$ of the wafer W, wherein the start position $Z_{start}$ is at the maximum position $Z_{max}$. FIG. 3B further illustrates acceleration A and velocity V having a maximum acceleration $A_{max}$ and maximum velocity $V_{max}$ associated with the move profile $Z(i)$ of the wafer, wherein $Z_{max}$, $V_{max}$ and $A_{max}$ are generally determined by the process recipe. Furthermore, according to another exemplary aspect, the number of position points, or discretization interval used to generate $Z(i)$, should be further be selected such that adequate model accuracy is attained.

According to another exemplary aspect of the present invention, the thermal model 40 of FIG. 2 receives the measured wafer temperature T and wafer position $Z_{actual}$ as inputs, determines the theoretical position $Z_{model}$ of the wafer W, and the controller 26 is further operable to calculate an offset position $Z_{modelOffset}$ between the theoretical position $Z_{model}$ and the actual measured position $Z_{actual}$ of the wafer within the process chamber 20. Such a calculation of $Z_{modelOffset}$, for example, may be performed by a summer 42. The offset position $Z_{modelOffset}$, for example, is a measure of the difference between the actual wafer Z position and the model-predicted wafer Z position for a given temperature T and modeled rate of temperature change $T_{dotModel}$, wherein:

$$Z_{modelOffset}=Z_{actual}-Z_{model}. \qquad (22)$$

$Z_{modelOffset}$, for example, is calculated with each update from the temperature measurement system 36 and motion control system 28. A positive value for $Z_{modelOffset}$ indicates that the thermal model would produce the actual measured temperature T at a Z position which is lower than the actual measured position $Z_{actual}$. In other words, the thermal model would produce a higher temperature T at the actual measured Z position. Likewise, the converse is true for negative values of $Z_{modelOffset}$.

Figure 4:
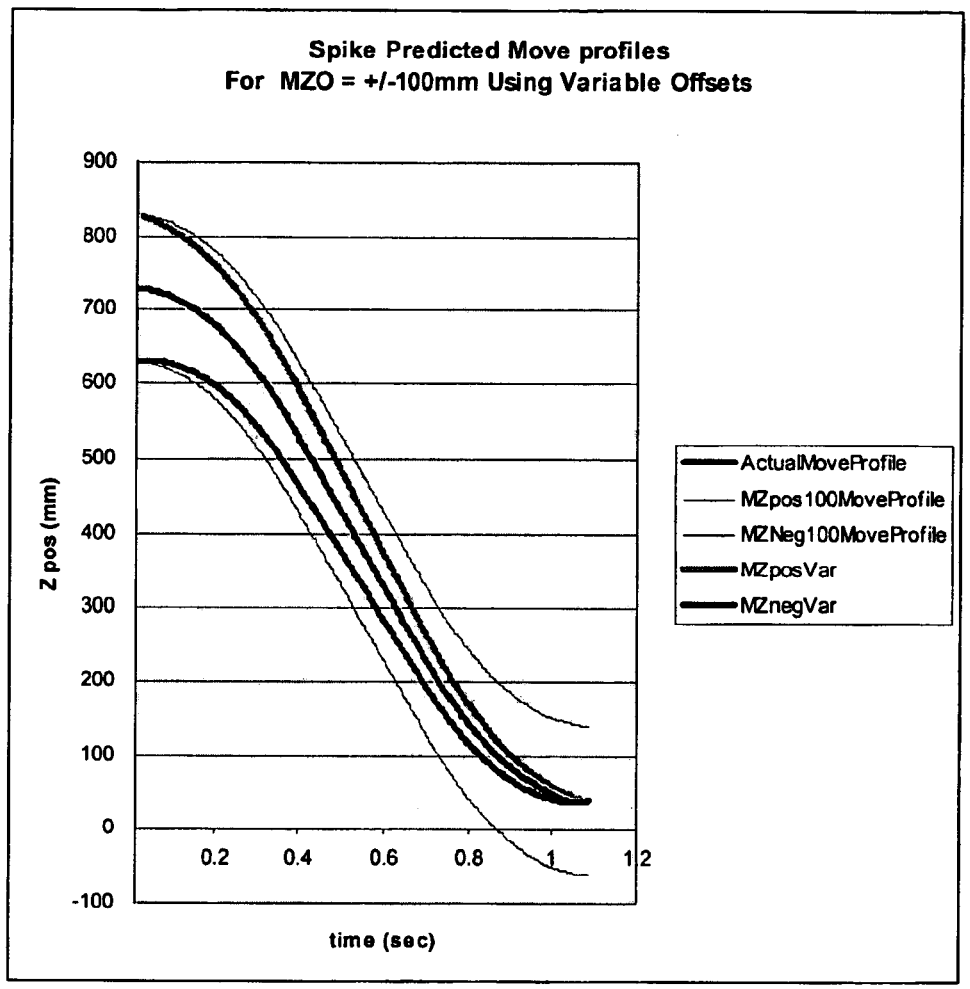
FIG. 4 is a chart of several predicted wafer movement profiles having varying offsets in accordance with another exemplary aspect of the present invention.

Consequently, the move profile $Z(i)$ can be accelerated or retarded in the predicted temperature profile $T(Z(i))$ by an amount commensurate with the $Z_{modelOffset}$. The effect would be to generally shift the predicted temperature $T_{max}$ in the desired direction, wherein $Z(i)$ would be slowed down resulting in a lower trigger temperature for runs with a positive $Z_{modelOffset}$, while $Z(i)$ would be sped up resulting in a higher trigger temperature for runs with a negative $Z_{modelOffset}$. For example, the full value of the $Z_{modelOffset}$ correction can be used at the start of the move profile $Z(i)$, wherein $Z_{modelOffset}$ is reduced proportionally down to zero at the $Z_{end}$. This is approximately the same as moving from $(Z_{startActual}-Z_{modelOffset})$ to $(Z_{endActual}-0)$ rather than from $(Z_{startActual}-Z_{modelOffset})$ to $(Z_{endActual}-Z_{modelOffset})$. This example of the use of the $Z_{modelOffset}$ to generate $Z_{adjusted}(i)$ can be further described by:

$$Z_{adjusted}(i)=Z(i)-Z_{modelOffset}(1-(i/N-1)) \qquad (23)$$

recalling that N is the total number of points in the $Z(i)$ array. Exemplary move profiles $Z(i)$ are further illustrated in FIG. 4.

Figure 5:
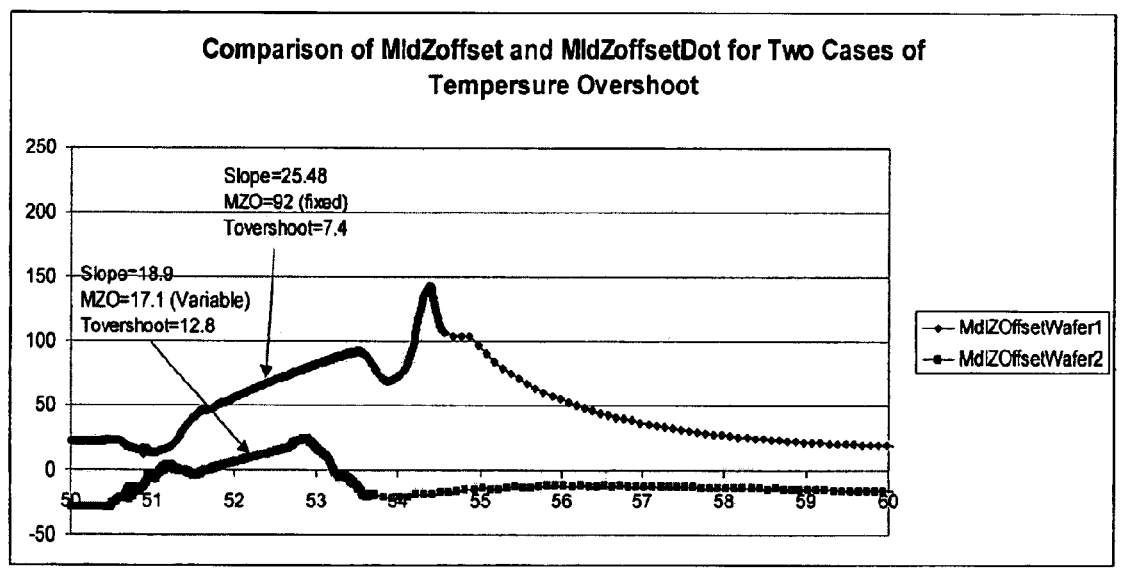
FIG. 5 is a chart of a comparison between two exemplary offsets according to another exemplary aspect of the present invention.

Varying the speed of the modeled downward move, for example, is an indirect way of compensating for error in the thermal model. In one example, rather than adjusting the move profile $Z(i)$ based on $Z_{modelOffset}$, the predicted temperature profile could be run with a thermal mass constant scaled by a value that is a function of the $Z_{modelOffset}$. Furthermore, the time rate of change $Z_{modelOffset}$ of $Z_{modelOffset}$ while the wafer W is waiting at the top of the bell jar may provide a better indicator of model error. For example, the magnitude of $Z_{modelOffsetDot}$ during this period is an indication of how quickly the thermal model is diverging from actual measurements, and may better reflect the difference in time constants. FIG. 5 compares two exemplary runs of different wafers W having different values of $Z_{modelOffset}$, $Z_{modelOffsetDot}$ and $T_{overshoot}$, wherein $T_{overshoot}$ is the amount of overshoot between actual and modeled temperatures. The ratio of the $Z_{modelOffset}$ slopes, for example, may indicate that the difference in time constants is not as large as the ratio of $Z_{modelOffset}$ values (e.g., 0.18) suggests. In the case of Wafer2, the initial negative value of $Z_{modelOffset}$ reduces the final $Z_{modelOffset}$ value, and thus reduces the compensation, accordingly.

Figure 6:
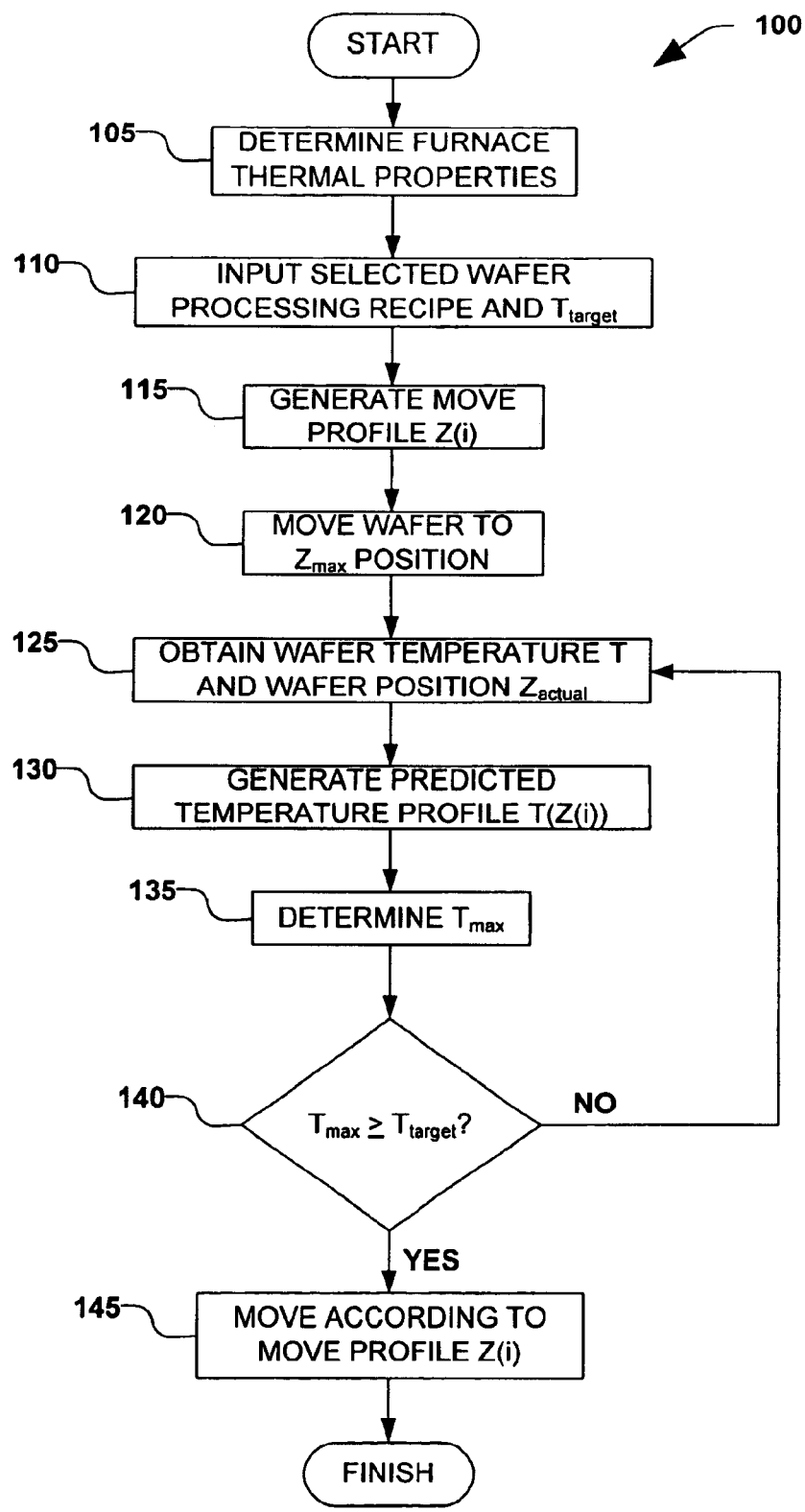
FIG. 6 is a flow chart diagram illustrating an exemplary methodology for thermally processing a substrate according to the present invention.

According to still another exemplary aspect of the present invention, FIG. 6 is a schematic block diagram of an exemplary method 100 illustrating the integration and operation of the exemplary thermal processing system 10 of FIGS. 1 and 2. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 100 begins with act 105, wherein thermal properties of the thermal processing system are determined. Such a determination, for example, can be from experimental figures or theoretical modeling of the thermal processing system. In act 110, a selected wafer processing recipe and target temperature are input to a controller, wherein the processing recipe comprises, for example, a maximum velocity, acceleration, and start and end positions of the substrate within a thermal furnace. The target temperature, for example, can further comprise a target temperature profile, comprising a plurality of target temperatures to be achieved at varying times during processing.

In act 115, a move profile is generated, wherein the move profile dictates a movement of the wafer within the thermal processing system. The move profile, for example, is predetermined, and does not vary from wafer to wafer. The wafer is then moved to a predetermined position in act 120, such as moving the wafer to a maximum or start position in the thermal processing system wherein the position is dictated by the process recipe. The wafer is then subjected to heat in the maximum position, and a wafer temperature and wafer position are obtained in act 125. The wafer temperature and position are then utilized, in conjunction with a thermal model of the process chamber and substrate, to predict a temperature profile T(Z(i)) as a function of position of the wafer in act 130.

A maximum temperature associated with the predicted temperature profile is determined in act 135, such as by an interpolation of the predicted temperatures, and the maximum temperature is compared to the target temperature in act 140. If the maximum predicted temperature is greater than or equal to the target temperature, then the move profile Z(i) is invoked in act 145, and the wafer is moved according to the predetermined move profile. If, however, the maximum predicted temperature is less than the target temperature, then another temperature measurement is made in act 125 and the process continues until the maximum predicted temperature is greater than or approximately equal to the target temperature.

It should be noted that a significant advantage of the present invention is that the controller 26 of FIGS. 1 and 2 processes the measured temperature T with the predicted temperature profile in order to determine when to move the wafer W within the process chamber 20, such as when performing a spike anneal on the wafer. Specifically, the controller 26 processes the predicted temperature profile to generate an appropriate time to move the elevator during processing to achieve the target temperature $T_{target}$ at the wafer W, while not overshooting or undershooting the target temperature. Another significant advantage of the present invention is that the controller 26 utilizes a predetermined Z position and speed of the wafer W within the process chamber 20 thus ameliorating potential overshoot and undershoot potentials based on faulty modeling, variabilities in the process chamber, or the like. Such an adaptive model-based control algorithm as taught by the present invention accounts for varying absorption properties of product wafers. Furthermore, the controller 26 need not control operation of other system components that could introduce or affect the processing of the wafer.

Another significant advantage of the present invention is that the control scheme can be further utilized in other process chambers which regulate the amount of heat provided to the wafer in various ways other than by an elevator mechanism. For example, in a lamp-based system, the control scheme can be modified to regulate the power or application of power to an array of one or more lamps based on the predicted temperature profile, wherein instead of varying a position of the wafer, an amount of power to the one or more lamps is varied in accordance with the intended temperature profile of the substrate. Furthermore, it shall be understood that the present invention can be adapted to suit various other thermal processing systems, such as non-lamp based systems (e.g., laser-sourced thermal processing systems, etc.) and all such variations are contemplated as falling within the scope of the present invention.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method for thermally processing a substrate, the method comprising:
    providing an intended substrate temperature profile;
    providing an amount of heat to the substrate in a thermal processing system;
    measuring one or more temperatures associated with one or more respective locations on the substrate;
    generating a predicted temperature profile, wherein a predicted temperature of the substrate is based on the amount of heat provided and the one or more measured temperatures; and
    regulating the amount of heat provided to the substrate based on the predicted temperature profile, wherein the substrate is thermally processed generally according to the intended substrate temperature profile.

2. The method of claim 1, wherein the intended substrate temperature profile comprises a peak target temperature.

3. The method of claim 2, wherein the amount of heat provided to the substrate is reduced when the predicted temperature is greater than or equal to the peak target temperature.

4. The method of claim 3, wherein the thermal processing system comprises a thermal processing furnace.

5. The method of claim 4, wherein the amount of heat provided to the substrate is regulated by generally controlling a position of the substrate within the furnace.

6. The method of claim 5, further comprising providing a move profile of the substrate,
    wherein the move profile is generally determined by a predetermined process recipe associated with the thermal processing system,
    wherein a future position of the substrate within the furnace is associated with the move profile, and
    wherein the predicted temperature of the substrate is further based on the future position of the substrate associated with the move profile.

7. A method for thermally processing a substrate, the method comprising:
    providing an intended substrate temperature profile comprising a peak target temperature;
    providing an amount of heat to the substrate in a thermal processing system comprising a thermal processing furnace;

providing a move profile of the substrate, wherein the move profile is generally determined by a predetermined process recipe associated with the thermal processing system, wherein a future position of the substrate within the furnace is associated with the move profile;

measuring one or more temperatures associated with one or more respective locations on the substrate;

generating a predicted temperature profile, wherein a predicted temperature of the substrate is based on the amount of heat provided, the one or more measured temperatures, and the future position of the substrate associated with the move profile;

regulating the amount of heat provided to the substrate based on the predicted temperature profile, wherein the substrate is thermally processed generally according to the intended substrate temperature profile, wherein the amount of heat provided to the substrate is regulated by generally controlling a position of the substrate within the furnace, wherein the amount of heat provided to the substrate is reduced when the predicted temperature is greater than or equal to the peak target temperature; and moving the substrate to the future position when the predicted temperature is greater than or equal to the peak target temperature.

8. A method for thermally processing a substrate, the method comprising:

providing an intended substrate temperature profile comprising a peak target temperature;

providing an amount of heat to the substrate in a thermal processing system comprising a thermal processing furnace;

providing a move profile of the substrate, wherein the move profile is generally determined by a predetermined process recipe associated with the thermal processing system, wherein the process recipe comprises one or more of a start position, an end position, a maximum velocity, and a maximum acceleration of the substrate within the furnace, and wherein a future position of the substrate within the furnace is associated with the move profile;

measuring one or more temperatures associated with one or more respective locations on the substrate;

generating a predicted temperature profile, wherein a predicted temperature of the substrate is based on the amount of heat provided, the one or more measured temperatures, and the future position of the substrate associated with the move profile; and regulating the amount of heat provided to the substrate based on the predicted temperature profile, wherein the substrate is thermally processed generally according to the intended substrate temperature profile, wherein the amount of heat provided to the substrate is regulated by generally controlling a position of the substrate within the furnace, wherein the amount of heat provided to the substrate is reduced when the predicted temperature is greater than or equal to the peak target temperature.

9. The method of claim 6, wherein the target temperature is generally determined by the process recipe.

10. The method of claim 4, wherein the amount of heat provided to the substrate is regulated by generally removing the substrate from the furnace.

11. The method of claim 3, wherein the thermal processing system comprises an array of one or more thermal lamps.

12. The method of claim 11, wherein the amount of heat provided to the substrate is regulated by generally actuating or de-actuating the array of lamps.

13. The method of claim 1, wherein at least one of the one or more locations is at or near a center of the substrate.

14. A method for thermally processing a substrate in a thermal processing system, the method comprising:

providing a predetermined process recipe for thermally processing the substrate;

determining an intended processing profile based, at least in part, on the process recipe;

exposing the substrate to an amount of incident thermal energy, wherein the amount of incident thermal energy is based, at least in part, on the process recipe;

measuring one or more temperatures associated with one or more respective locations on the substrate;

determining a theoretical amount of incident thermal energy exposed to the substrate using thermal model based on the one or more measured temperatures and the exposed amount of incident thermal energy;

predicting a temperature profile of the substrate, wherein the predicted temperature profile is based, at least in part, on the intended process profile, the theoretical amount of incident thermal energy, and the one or more measured temperatures; and regulating the amount of incident thermal energy, wherein the regulation is based, at least in part, on a comparison of the predicted temperature profile and a desired temperature profile.

15. A method for thermally processing a substrate in a thermal processing system, the method comprising:

providing a target substrate temperature;

generating a move profile of the substrate between a first position and a second position within the thermal processing system;

providing an amount of heat to the substrate in the first position;

measuring one or more temperatures associated with one or more respective locations on the substrate in the first position;

generating a theoretical position of the substrate, wherein the theoretical position is based on the one or more measured temperatures, the position of the substrate within the thermal processing system, and a thermal model of one or more of the thermal processing system and the substrate;

generating a predicted temperature profile of the substrate in accordance with the move profile of the substrate, wherein the predicted temperature profile is based on the one or more measured temperatures and the theoretical position of the substrate;

determining a maximum predicted temperature based on the predicted temperature profile; and moving the substrate to the second position according to the move profile when the maximum predicted temperature is greater than or equal to the target substrate temperature.

16. The method of claim 15, wherein generating the predicted temperature profile comprises determining a predicted rate of temperature change of the substrate.

17. The method of claim 15, wherein generating the theoretical position of the substrate comprises determining an offset to the theoretical position of the substrate from the first position of the substrate.

18. The method of claim 17, wherein the move profile is adjusted according to the offset.

19. The method of claim 15, wherein the move profile is generated based on a process recipe associated with the thermal processing system.

20. The method of claim 19, wherein the process recipe comprises one or more of a start position associated with the first position, an end position associated with the second position, a maximum velocity and a maximum acceleration of the substrate within the thermal processing system.

21. The method of claim 15, wherein the maximum predicted temperature is determined based on an interpolation of the predicted temperature profile.

22. The method of claim 15, wherein at least one of the one or more locations is at or near a center of the substrate.

23. The method of claim 15, wherein the thermal processing system comprises a vertical thermal processing furnace.

24. The method of claim 15, further comprising moving the substrate from a third position to the first position prior to providing the amount of heat to the substrate in the first position.

* * * * *